United States Patent
Gealy et al.

(10) Patent No.: US 9,716,226 B2
(45) Date of Patent: Jul. 25, 2017

(54) ELECTRODE MATERIALS AND INTERFACE LAYERS TO MINIMIZE CHALCOGENIDE INTERFACE RESISTANCE

(71) Applicant: Intel Corporation, Santa Clara, CA (US)

(72) Inventors: F. Daniel Gealy, Kuna, ID (US); Andrea Gotti, Vaprio d'Adda (IT); Davide Colombo, Milan (IT); Kuo-Wei Chang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/366,364

(22) Filed: Dec. 1, 2016

(65) Prior Publication Data

US 2017/0084835 A1     Mar. 23, 2017

Related U.S. Application Data

(62) Division of application No. 14/073,927, filed on Nov. 7, 2013, now Pat. No. 9,543,515.

(51) Int. Cl.
*H01L 21/00* (2006.01)
*H01L 45/00* (2006.01)
*H01L 27/24* (2006.01)

(52) U.S. Cl.
CPC ...... *H01L 45/1608* (2013.01); *H01L 27/2481* (2013.01); *H01L 45/06* (2013.01);
(Continued)

(58) Field of Classification Search
CPC .. H01L 45/1608; H01L 45/06; H01L 45/1253
See application file for complete search history.

(56) References Cited

U.S. PATENT DOCUMENTS

| 5,329,161 A * | 7/1994 | Vines ............... H01L 23/53223 257/383 |
| 7,777,212 B2 * | 8/2010 | An ...................... G11C 13/0004 257/2 |

(Continued)

FOREIGN PATENT DOCUMENTS

| JP | 59039049 A * | 3/1984 |
| JP | 2008182234 A | 8/2008 |

(Continued)

OTHER PUBLICATIONS

English Translation of the Notice of Preliminary Rejection, Application No. 10-2016-7008852, Mailed Apr. 19, 2017, 2 pages.

(Continued)

*Primary Examiner* — Laura Menz
(74) *Attorney, Agent, or Firm* — Compass IP Law PC

(57) ABSTRACT

A phase-change memory cell having a reduced electrode-chalcogenide interface resistance and a method for making the phase-change memory cell are disclosed: An interface layer is formed between an electrode layer and a chalcogenide layer that and provides a reduced resistance between the chalcogenide-based phase-change memory layer and the electrode layer. Exemplary embodiments provide that the interface layer comprises a tungsten carbide, a molybdenum carbide, a tungsten boride, or a molybdenum boride, or a combination thereof. In one exemplary embodiment, the interface layer comprises a thickness of between about 1 nm and about 10 nm.

11 Claims, 5 Drawing Sheets

(52) U.S. Cl.
CPC ...... *H01L 45/1233* (2013.01); *H01L 45/1253* (2013.01); *H01L 45/144* (2013.01)

(56) References Cited

U.S. PATENT DOCUMENTS

| | | | | |
|---|---|---|---|---|
| 8,551,805 | B2* | 10/2013 | Oh | H01L 45/06 257/4 |
| 8,729,519 | B2* | 5/2014 | Redaelli | H01L 45/00 257/2 |
| 8,828,788 | B2* | 9/2014 | Erbetta | H01L 45/04 257/2 |
| 8,872,150 | B2* | 10/2014 | Redaelli | H01L 45/00 257/2 |
| 8,987,698 | B2* | 3/2015 | Redaelli | H01L 45/00 257/2 |
| 9,054,295 | B2* | 6/2015 | Gotti | H01L 45/06 |
| 9,543,515 | B2* | 1/2017 | Gealy | H01L 45/06 |
| 2008/0173858 | A1* | 7/2008 | An | G11C 13/0004 257/3 |
| 2011/0147695 | A1* | 6/2011 | Lee | H01L 27/2427 257/4 |
| 2012/0322223 | A1* | 12/2012 | Oh | H01L 45/06 438/382 |
| 2013/0048935 | A1* | 2/2013 | Gotti | H01L 45/06 257/2 |
| 2015/0123066 | A1* | 5/2015 | Gealy | H01L 45/06 257/4 |

FOREIGN PATENT DOCUMENTS

| | | | | |
|---|---|---|---|---|
| JP | | 2011222952 A | 11/2011 | |
| JP | | 2011243980 A | 12/2011 | |
| WO | WO 2015069468 A1 * | | 5/2015 | H01L 45/06 |

OTHER PUBLICATIONS

Organized Translation of "Notice of Reasons for Rejection" for Japanese Patent Application No. 2016-519800, Mailed Jun. 8, 5 pages.

* cited by examiner

ELECTRODE MATERIALS AND INTERFACE LAYERS TO MINIMIZE CHALCOGENIDE INTERFACE RESISTANCE

CROSS-REFERENCE TO RELATED APPLICATIONS

The present application is a divisional of and claims the benefit of U.S. patent application Ser. No. 14/073,927, filed Nov. 7, 2013, the subject matter of which is incorporated herein by reference in its entirety.

TECHNICAL FIELD

Embodiments of systems and techniques described herein relate to memory devices. More particularly, embodiments of systems and techniques described wherein relate to phase-change cross-point memory systems comprising materials providing reduced electrode-chalcogenide interface resistances.

BACKGROUND

High resistance at an electrode-chalcogenide interface in chalcogenide-based phase-change memories requires that either a higher operating voltage be used or that a reduced drive voltage be available for chalcogenide phase changing. Additionally, the high local temperatures that are associated with the operation of phase-change memory (in excess of 600 C) make probable an electrode-chalcogenide reaction that adversely affects device performance.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
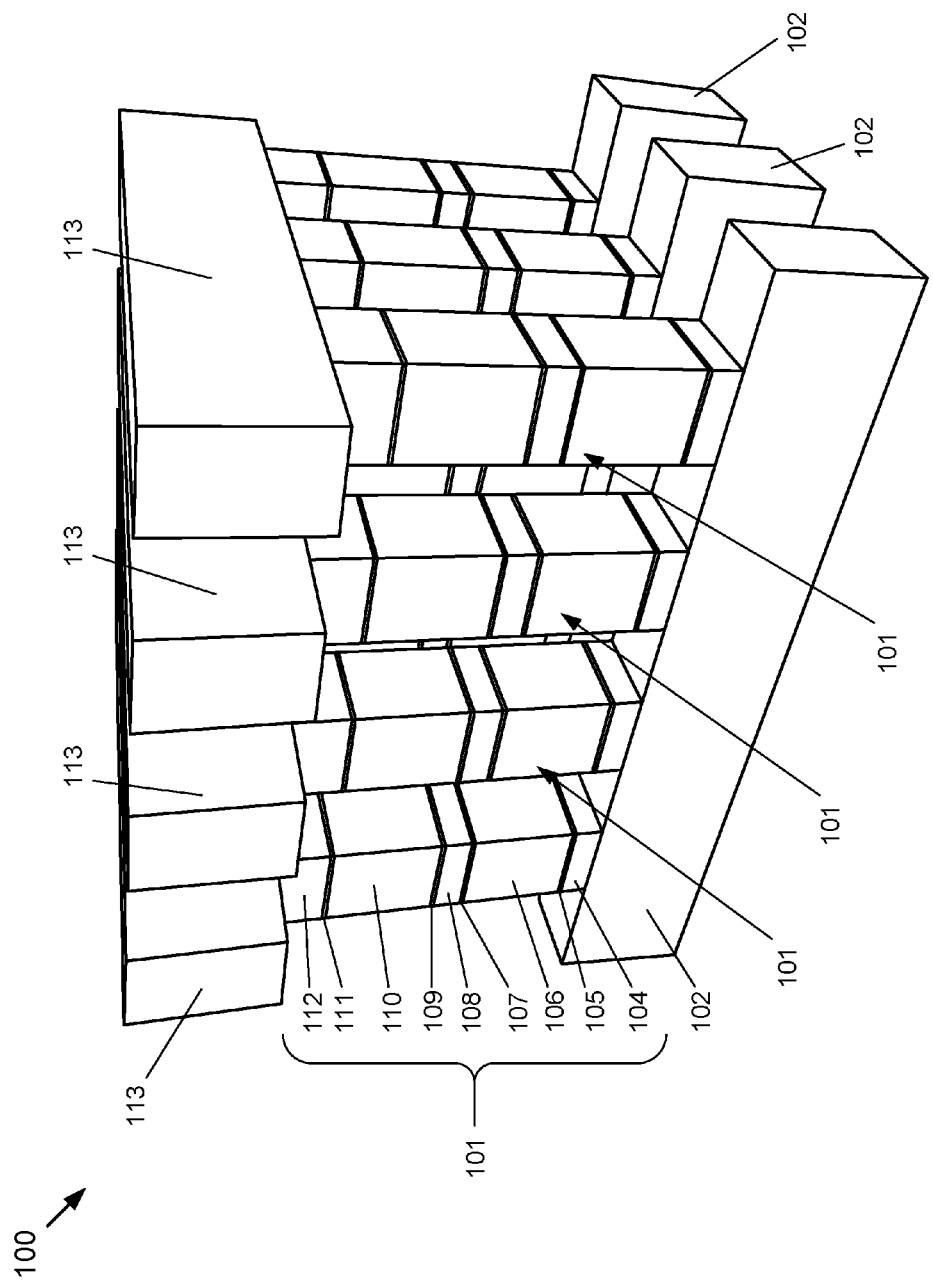
FIG. 1 depicts a perspective view of one exemplary embodiment of a portion of a chalcogenide-based phase-change cross point memory comprising tungsten and molybdenum carbide and boride interface layers according to the subject matter disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to semiconductor memories and, more particularly, to systems and techniques described wherein relate to phase-change cross-point memory systems comprising materials providing reduced electrode-chalcogenide interface resistances. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The subject matter disclosed herein relates to methods, materials and structures that provide a reduced electrode-chalcogenide interface resistance and that is stable for phase-change operation of a chalcogenide memory. More specifically, the subject matter disclosed herein relates to methods, materials and structures that comprise an interface layer between an electrode layer and a chalcogenide layer that provides a reduced resistance in comparison to an electrode-chalcogenide interface without the interface layer of the subject matter disclosed herein. Embodiments of the subject matter disclosed herein utilize interface layers comprising carbides and/or borides of tungsten (W) and/or molybdenum (Mo) (W/Mo) that are formed between composite electrodes and chalcogenide memory cell layers. In one exemplary embodiment, the W/Mo carbide and/or boride interface layers are formed by a reactive physical vapor deposition (PVD) technique (e.g., reactive sputtering) using tungsten and/or molybdenum and unsaturated organic carbon compounds, such as benzene and acetylene. In another exemplary embodiment, the W/Mo carbide and/or boride interface layers are formed by non-reactively sputtering from W/Mo carbide and/or boride targets.

Chalcogenides, such as tellurium (Te) and selenium (Se), readily react with tungsten (W) and molybdenum (Mo) at elevated temperatures. Tungsten (W) is known to reduce interface resistance between C and various GST-based (Germanium-Antimony-Tellurium) phase-change memory materials. Molybdenum also demonstrates similar properties. Reactivity with Se and Te, however, make elemental tungsten and molybdenum unsuitable as electrode-chalcogenide interface layers because the high local temperatures that are associated with the operation of phase-change memory (in excess of 600 C) make an electrode-chalcogenide reaction likely. Accordingly, refractory materials comprising a high melting temperature, such as conductive carbides and borides, which melt in excess of 1200 C, are suitable for such high-temperature applications.

Techniques for depositing the tungsten and molybdenum carbides include reactive sputtering using a tungsten (W) and/or molybdenum (Mo) (W/Mo) target with organics compounds, such as benzene ($C_6H_6$), acetylene ($C_2H_2$), or other unsaturated carbon-bonded organic compounds, such as ethane, propene, dicyanoacetylene, and cyanogens, and Ar, or direct sputter from a carbide target. Similarly, tungsten and molybdenum borides can be reactively sputtered from similar targets using diborane/Ar or deposited from boride targets. According to the subject matter disclosed wherein, the W/Mo carbide and boride interface layers are not simple mixtures of W, Mo with carbon or boron. Instead, the W/Mo carbide and boride layers are bonded materials and are deposited as such because the temperatures required to form the interface layers on a wafer using simple anneals are not practical, that is, silicon melts. Additionally, relatively thick interface layers of carbides and borides of tungsten and molybdenum may be rough; consequently, embodiments of the subject matter disclosed herein utilize thin layers ranging from about 1 nm to about 10 nm in thickness between the electrodes and a chalcogenide memory cell. In one exemplary embodiment, reactively sputtered films from W/acetylene are smooth (and amorphous), and with hardness exceeding elemental tungsten and a stoichiometry consistent with tungsten carbide (WC).

FIG. 1 depicts a perspective view of one exemplary embodiment of a portion of a chalcogenide-based phase-change cross point memory array 100 comprising tungsten and/or molybdenum carbide and/or boride interface layers according to the subject matter disclosed herein. According to the subject matter disclosed herein, the interface layers are formed between electrode layers and chalcogenide layers and provide a reduced resistance in comparison to an electrode-chalcogenide interface without a carbide- and/or boride-based interface layer. Cross-point memory 100 can be, but is not limited to, part of a solid-state memory array or a solid-state drive. Cross point memory 100 comprises a plurality of memory cells 101 that are each arranged in a column (or pillar), of which only a few are indicated. Additionally, it should be understood that a dielectric material that is normally between memory cells 101 is not shown in FIG. 1 for clarity.

Each memory cell 101 comprises an electrode 104 formed on a word line metallization 102. An electrode-chalcogenide interface layer 105 is formed on electrode 104. A switching device (SD) 106 is formed on interface layer 104. An electrode-chalcogenide interface layer 107 is formed on SD 106. An electrode 108 is formed on interface layer 107. An electrode-chalcogenide interface layer 109 is formed on electrode 108. A chalcogenide memory cell (MC) 110 is formed on interface layer 109. An electrode-chalcogenide interface layer 111 is formed on MC 110. An electrode 112 is formed on interface layer 111. A bit line metallization layer 113 is formed on electrode 112.

In embodiments of the subject matter disclosed herein, word line metallization layer 102 and bit line metallization layer 113 are formed from, for example, tungsten, copper and/or aluminum. In one exemplary embodiment, electrode layers 104, 108 and 112 are composite electrodes that are formed from, for example, carbon (C) and/or titanium nitride (TiN). In one exemplary embodiment, switching device (SD) 106 is formed from, for example, an OTS (Ovonic Threshold Switch) comprising a glassy mixture of the chalcogenides, such as, but not limited to, Te and Se, and glass forming additives such as, but not limited to, arsenic (As), germanium (Ge) and silicon (Si). Note that this is not an exhaustive list of either chalcogenides or glass forming additives. In one exemplary embodiment, chalcogenide memory cell 110 is formed from, for example, but is not limited to, $Ge_2Sb_2Te_5$ (GST) and $In_3SbTe_2$ (IST).

In one exemplary embodiment, electrode-chalcogenide interface layers 105, 107, 109 and 111 are formed from carbides and/or borides of tungsten (W) and/or molybdenum (Mo). In one exemplary embodiment, interface layers 105, 107, 109 and 111 are formed by using, for example, a reactive physical vapor deposition (PVD) (e.g., reactive sputtering) from W/Mo targets using unsaturated organic carbon compounds, such as benzene and acetylene. In another exemplary embodiment, interface layers 105, 107, 107 and 111 are formed non-reactively by being sputtered from W/Mo carbide and boride targets. Although interface layers 105, 107, 109 and 111 are depicted in FIG. 1, it should be understood that alternative exemplary embodiments may have fewer interface layers. That is, alternative exemplary embodiments may not have an interface layer according to the subject matter disclosed herein between each electrode layer and chalcogenide layer.

The deposited tungsten and/or molybdenum carbide and/or boride layers are highly conductive refractory materials and may be rough (when sputtered from carbide/boride targets and reactively sputtered from $W/C_6H_6$); consequently, embodiments of the subject matter disclosed herein utilize thin layers ranging from about 1 nm to about 10 nm formed between composite electrode stacks of carbon (C) or titanium nitride (TiN), and a chalcogenide memory cell. Moreover, because graphitic carbon conduction is often filamentary, thin or even discontinuous, interface tungsten and/or molybdenum carbide and/or boride layers are suitable for reducing electrode/chalcogenide contact resistance.

Figure 2:
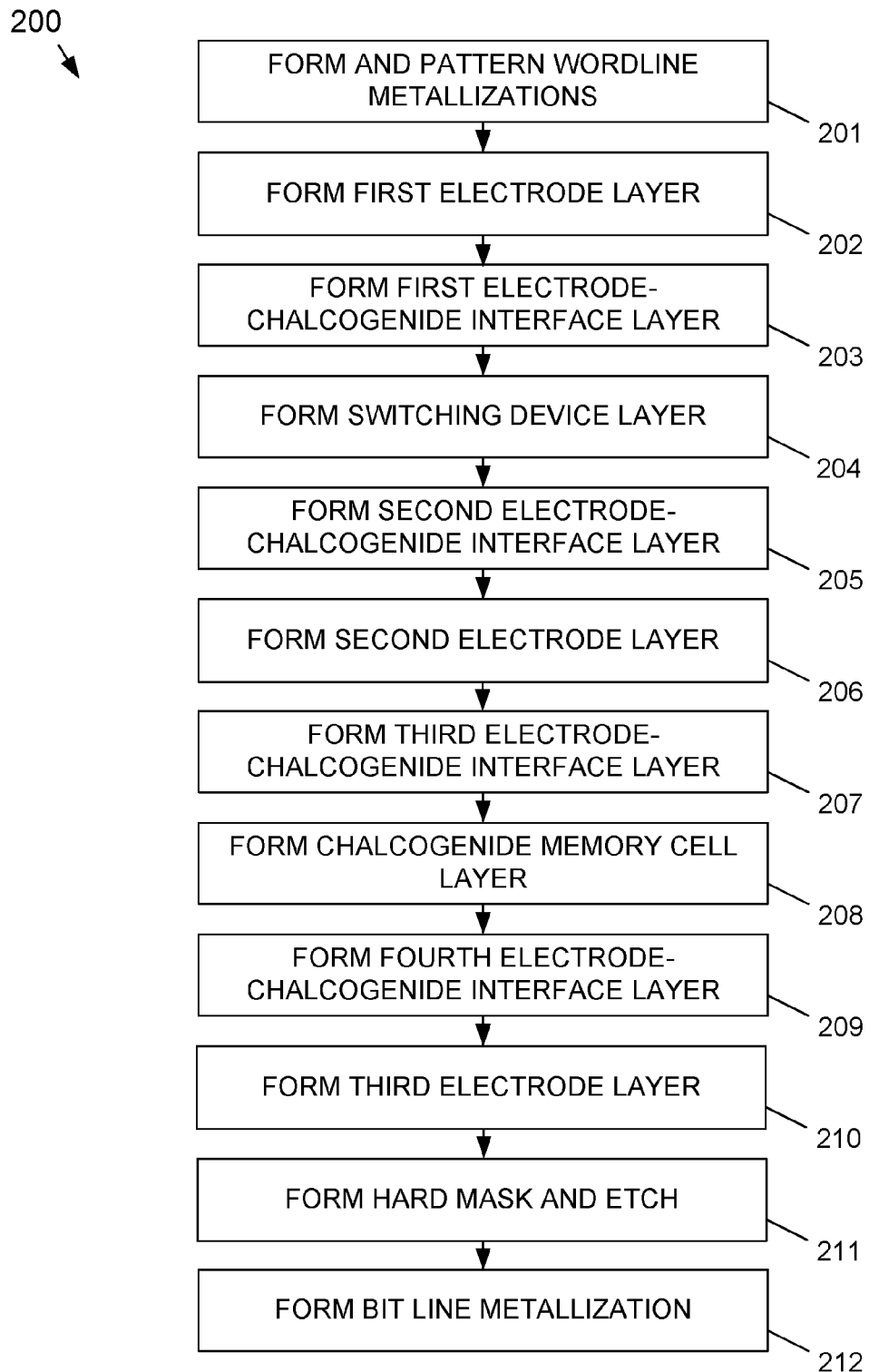
FIG. 2 is a flow diagram of an exemplary embodiment for forming a chalcogenide-based phase-change cross point memory comprising interface layers according to the subject matter disclosed herein.
Figure 3A:
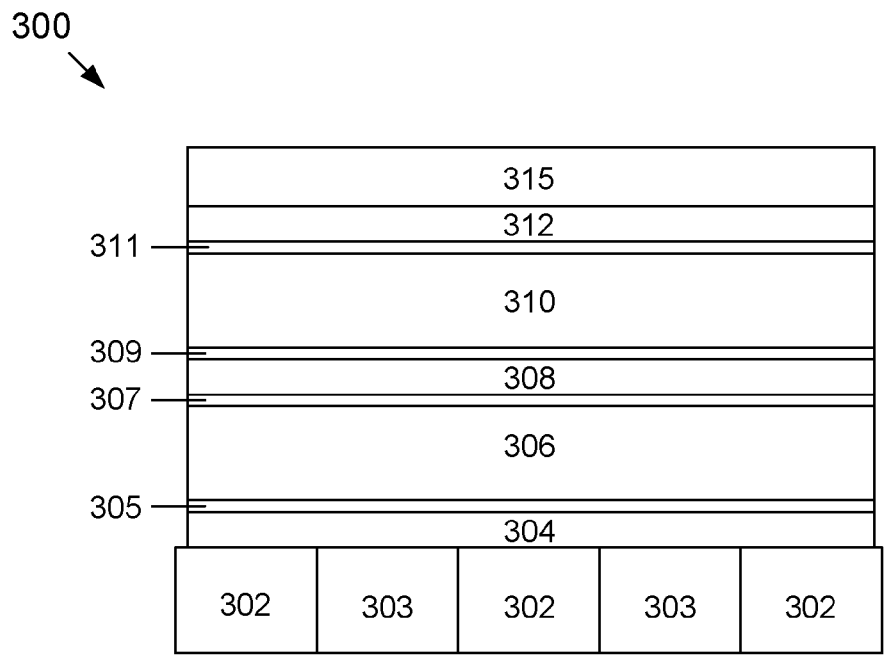
FIGS. 3A-3B respectively depict an exemplary embodiment of a chalcogenide-based phase-change cross point memory structure according to the subject matter disclosed herein prior to forming a cross-point memory column (pillar) array, and subsequent to forming the cross-point memory column (pillar) array.
Figure 3B:
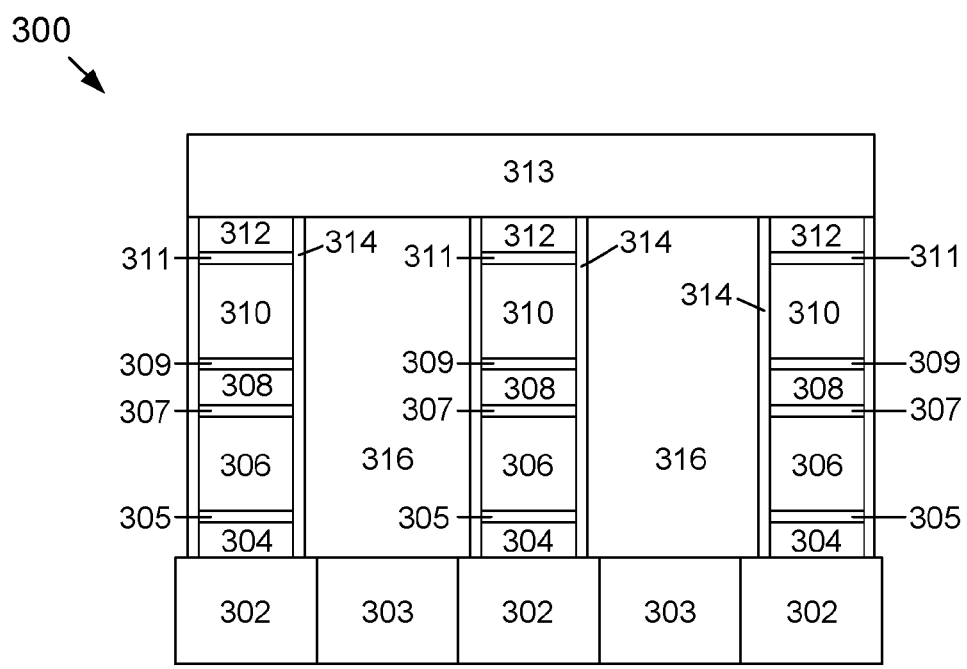

FIG. 2 is a flow diagram 200 of an exemplary embodiment for forming a chalcogenide-based phase-change cross point memory comprising interface layers according to the subject matter disclosed herein. FIGS. 3A-3B respectively depict an exemplary embodiment of a chalcogenide-based phase-change cross point memory structure 300 according to the subject matter disclosed herein prior to forming a cross-point memory column (pillar) array, and subsequent to forming the cross-point memory column (pillar) array.

At 201, word lines 302 are formed and patterned in a well-known manner on a substrate (not shown in FIGS. 3A and 3B). In one exemplary embodiment, word lines 302 can be formed from, for example, tungsten, copper and/or aluminum. A dielectric material 303, such as, silicon dioxide ($SiO_x$), silicon nitride ($SiN_x$) or other electrically insulating materials, is formed between word lines 302 in a well-known manner.

At 202, a first electrode layer 304 is formed in a well-known manner on word lines 302. In one exemplary embodiment, first electrode layer 304 is formed from, for example, carbon (C) and/or titanium nitride (TiN). At 203, a first electrode-chalcogenide interface layer 305 is formed on and in contact with first electrode layer 304 In one exemplary embodiment, first interface layer 305 is formed by using, for example, a reactive physical vapor deposition (PVD) (e.g., reactive sputtering) from W/Mo targets using unsaturated organic carbon compounds, such as benzene and acetylene. In another exemplary embodiment, first interface layer 305 is formed non-reactively by being sputtered from W/Mo carbide and/or boride targets.

At 204, a switching device (SD) layer 306 is formed in a well-known manner on and in contact with first interface layer 305. In one exemplary embodiment, switching device (SD) layer 306 can be formed from, for example, an OTS (Ovonic Threshold Switch) comprising a glassy mixture of the chalcogenides, such as, but not limited to, Te and Se, and glass forming additives such as, but not limited to, arsenic (As), germanium (Ge) and silicon (Si). At 205, a second electrode-chalcogenide interface layer 307 is formed on and in contact with SD layer 306. In one exemplary embodiment, second interface layer 307 is formed by using, for example, a reactive physical vapor deposition (PVD) (e.g., reactive sputtering) from W/Mo targets using unsaturated organic carbon compounds, such as benzene and acetylene. In another exemplary embodiment, second interface layer 307 is formed non-reactively by being sputtered from W/Mo carbide and/or boride targets.

At 206, a second electrode layer 308 is formed in a well-known manner on and in contact with second interface layer 307. In one exemplary embodiment, second electrode layer 308 can be formed from, for example, carbon (C) and/or titanium nitride (TiN). At 207, a third electrode-chalcogenide interface layer 309 is formed on and in contact with second electrode layer. In one exemplary embodiment, third interface layer 309 is formed by using, for example, a reactive physical vapor deposition (PVD) (e.g., reactive sputtering) from W/Mo targets using unsaturated organic carbon compounds, such as benzene and acetylene. In another exemplary embodiment, third interface layer 307 is formed non-reactively by being sputtered from W/Mo carbide and/or boride targets.

At 208, a chalcogenide memory cell (MC) layer 310 is formed in a well-known manner on and in contact with third interface layer 309. In one exemplary embodiment, chalcogenide memory cell layer 310 can be formed from, for example, but is not limited to, $Ge_2Sb_2Te_5$ (GST) and $In_3SbTe_2$ (IST). At 209, a fourth electrode-chalcogenide interface layer 311 is formed on and in contact with memory cell layer 310. In one exemplary embodiment, fourth interface layer 311 is formed by using, for example, a reactive physical vapor deposition (PVD) (e.g., reactive sputtering) from W/Mo targets using unsaturated organic carbon compounds, such as benzene and acetylene. In another exemplary embodiment, fourth interface layer 311 is formed non-reactively by being sputtered from W/Mo carbide and/or boride targets.

At 210, a third electrode layer 312 is formed in a well-known manner on and in contact with fourth interface layer 311. In one exemplary embodiment, third electrode layer 312 can be formed from, for example, carbon (C) and/or titanium nitride (TiN). At 211, a hard mask 315 is formed in a well-known manner on third electrode layer 312, and structure 300 is etched in a well-known manner to form a pillar arrangement that will become a cross point memory comprising an arrangement that is similar to that depicted in FIG. 1. FIG. 3A depicts structure 300 formed prior to etching.

FIG. 3B depicts structure 300 after etching to form a cross-point memory column (pillar) array. At 212, a bit line metallization layer 313 is formed on electrode 312. It should be understood that FIG. 3B also depicts a dielectric material 314 formed on each column (pillar), and a dielectric material 316 formed in a well-known manner between the columns (pillars) of structure 300. Dielectric materials used for 314 are typically insulating to force electrical conduction through the chalcogenide layers and can be formed from nonconductive oxides and nitrides including, but not limited, to $SiO_x$ and $SiN_x$. Although interface layers 305, 307, 309 and 311 are depicted in FIGS. 3A and 3B, it should be understood that alternative exemplary embodiments may have fewer interface layers. That is, alternative exemplary embodiments may not have an interface layer according to the subject matter disclosed herein between each electrode layer and chalcogenide layer. Alternatively, the interfacial layers according to the subject matter disclosed herein may be used with single chalcogenide devices as well.

Figure 4:
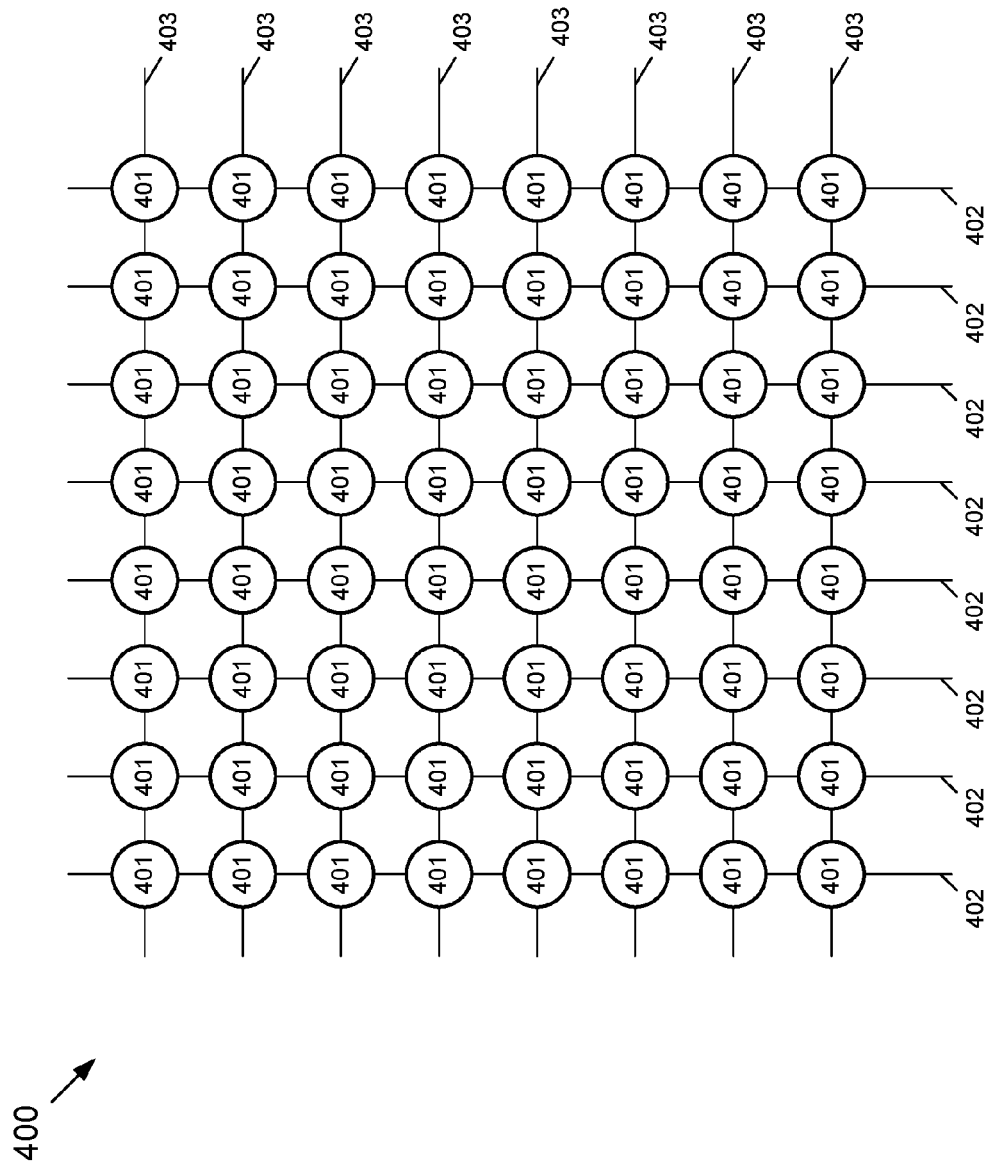
FIG. 4 depicts a schematic diagram of an exemplary embodiment of a cross-point memory array comprising a plurality of chalcogenide-based phase-change memory cells according to the subject matter disclosed herein.

FIG. 4 depicts a schematic diagram of an exemplary embodiment of a cross-point memory array 400 comprising a plurality of chalcogenide-based phase-change memory cells 401 according to the subject matter disclosed herein. In one exemplary embodiment, at least one memory cell 401 comprises tungsten and/or molybdenum carbide and/or boride interface layers according to the subject matter disclosed herein. As depicted in FIG. 4, memory cells 401 are located at intersections of column signal lines 402 (e.g., bit lines) and row signal lines 403 (e.g., word lines). Individual column and/or row signal lines are electrically connected in a well-known manner to a memory controller (not shown) to selectively operate memory cells 401 in a well-known manner. It should be understood that memory array 400 can comprise part of a solid-state memory array or a solid-state drive that is coupled in a well-known manner to a computer system or an information-processing system (not shown).

Figure 5:
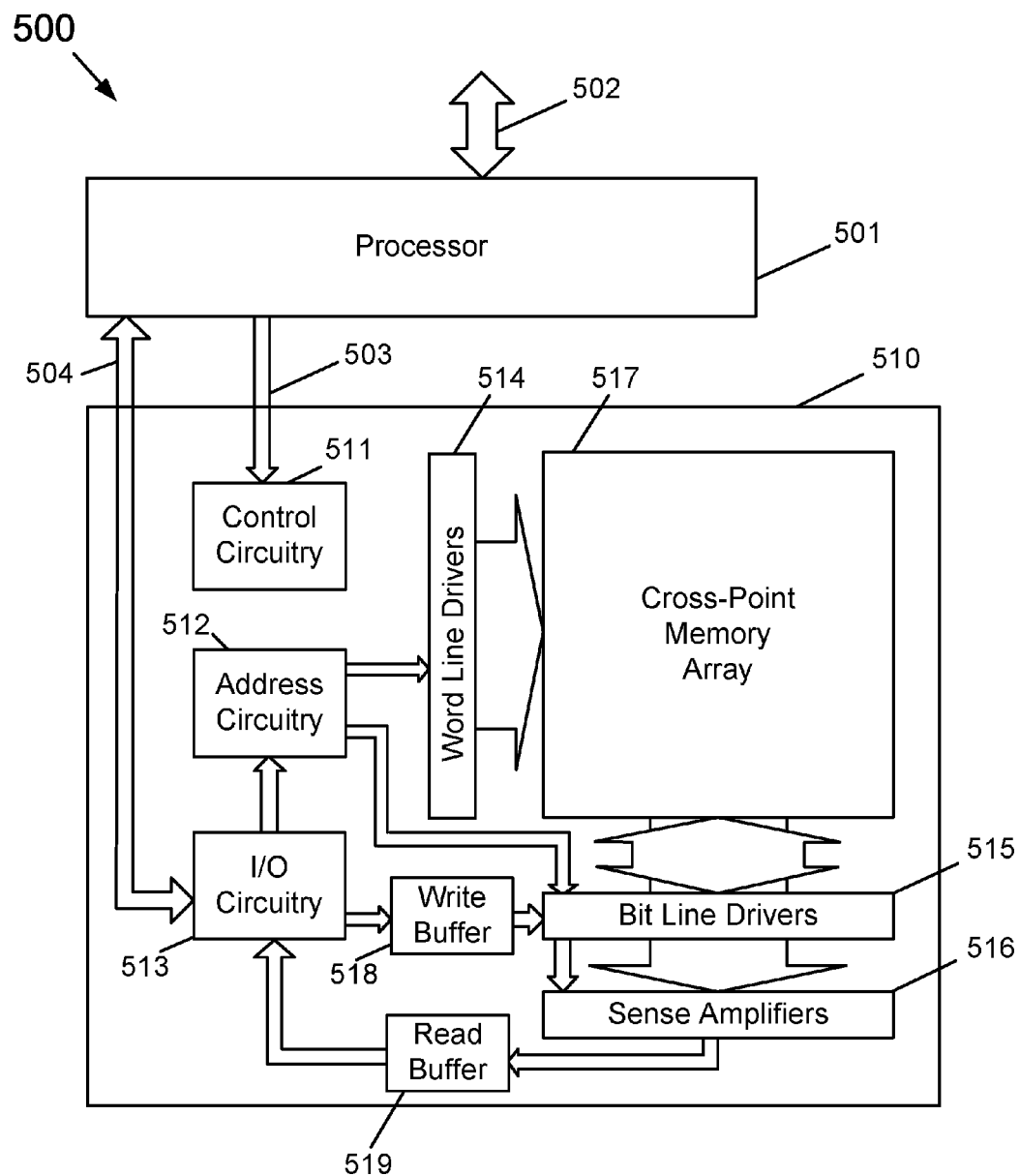
FIG. 5 depicts a functional block diagram of an exemplary embodiment of an electronic system comprising a chalcogenide-based phase-change cross point memory array according to the subject matter disclosed herein.

FIG. 5 depicts a functional block diagram of an exemplary embodiment of an electronic system 500 comprising a chalcogenide-based phase-change cross point memory array according to the subject matter disclosed herein. System 500 comprises a processor 501 that is coupled to a memory device 510 through control/address lines 503 and data lines 504. In some exemplary embodiments, data and control may utilize the same physical lines. In some exemplary embodiments, processor 501 may be an external microprocessor, microcontroller, or some other type of external controlling circuitry. In other exemplary embodiments, processor 501 may be integrated in the same package or even on the same die as memory device 510. In some exemplary embodiments, processor 501 may be integrated with the control circuitry 511, thereby allowing some of the same circuitry to be used for both functions. Processor 501 may have external memory, such as random access memory (RAM) (not shown) and/or read only memory (ROM) (not shown), that is used for program storage and intermediate data. Alternatively, processor 501 may have internal RAM or ROM. In some exemplary embodiments, processor 501 may use memory device 510 for program or data storage. A program running on processor 501 may implement many different functions including, but not limited to, an operating system, a file system, defective chunk remapping, and error management.

In some exemplary embodiments, an external connection 502 is provided that allows processor 501 to communicate to external devices (not shown). Additional I/O circuitry (not shown) may be used to couple external connection 502 to processor 501. If electronic system 500 is a storage system, external connection 502 may be used to provide an external device with non-volatile storage. In one exemplary embodiment, electronic system 500 may be, but is not limited to, a solid-state drive (SSD), a USB thumb drive, a secure digital card (SD Card), or any other type of storage system. External connection 502 may be used to connect to a computer or other intelligent device, such as a cell phone or digital camera, using a standard or proprietary communication protocol. Exemplary computer communication protocols that may be compatible with external connection 502 include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If electronic system 500 is a computing system, such as a mobile telephone, a tablet, a notebook computer, a set-top box, or some other type of computing system, external connection 502 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

Memory device 510 may include an array 517 of memory cells. Memory cell array 517 may be organized as a two dimensional or a three dimensional cross-point array and may be a phase-change memory (PCM), a phase-change memory with switch (PCMS), a resistive memory, nanowire memory, ferro-electric transistor random access memory (FeTRAM), a flash memory, magnetoresistive random access memory (MRAM) memory that incorporates memristor technology, a spin transfer torque (STT)-MRAM, or any other type of memory constructed as a cross-point array. In one exemplary embodiment, memory cell array 517 comprises a chalcogenide-based phase-change cross point memory array comprising tungsten and/or molybdenum carbide and/or boride interface layers according to the subject matter disclosed herein. Cross-point array 517 may be coupled to the word line drivers 514 and/or bit line drivers 515, and/or sense amplifiers 516 in a well-known manner. Address lines and control lines 503 may be received and decoded by control circuitry 511, I/O circuitry 513 and address circuitry 512, which may provide control to the memory array 517. I/O circuitry 513 may couple to data lines 504 thereby allowing data to be received from and sent to processor 501. Data read from memory array 517 may be temporarily stored in read buffers 519. Data to be written to memory array 517 may be temporarily stored in write buffers 518 before being transferred to the memory array 517.

It should be understood that electronic system 500 depicted in FIG. 5 has been simplified to facilitate a basic understanding of the features of the system. Many different embodiments are possible including using a single processor 501 to control a plurality of memory devices 510 to provide for more storage space. Additional functions, such as a video graphics controller driving a display, and other devices for human-oriented I/O may be included in some exemplary embodiments.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A method, comprising:
    forming a chalcogenide-based phase-change memory layer, the chalcogenide-based phase-change memory layer including a first side and a second side;
    forming a first interface layer including a first side and a second side, the first side of the first interface layer being in contact with the first side of the chalcogenide-based phase-change memory layer;
    forming a first electrode layer including a first side and a second side, the first side of the first electrode being in contact with the second side of the first interface layer, the first interface layer including a boride to provide a reduced resistance between the chalcogenide-based phase-change memory layer and the first electrode layer;
    forming a second interface layer including a first side and a second side, the first side of the second interface layer being in contact with the second side of the chalcogenide-based phase-change memory layer;
    forming a second electrode layer including a first side and a second side, the first side of the second electrode being in contact with the second side of the second interface layer, the second interface layer including boride to provide a reduced resistance between the chalcogenide-based phase-change memory layer and the second electrode layer;
    forming a third interface layer including a first side and a second side, the first side of the third interface layer being in contact with the second side of the second electrode layer;
    forming a switching device layer including a first side and a second side, the first side of the switching device being in contact with the second side of the third interface layer;
    forming a fourth interface layer including a first side and a second side, the first side of the fourth interface layer being in contact with the second side of the switching device layer; and
    forming a third electrode layer including a first side and a second side, the first side of the third electrode layer being in contact with the second side of the fourth interface layer.

2. The method according to claim 1, the first interface layer includes a tungsten boride, or a molybdenum boride, or a combination thereof.

3. The method according to claim 1, forming the first interface layer comprises reactively sputtering a tungsten target or a molybdenum target, or a combination thereof, using an unsaturated carbon compound.

4. The method according to claim 1, the first interface layer comprises a thickness of between about 1 nm and about 10 nm.

5. The method according to claim 1, the second interface layer comprises a tungsten boride, or a molybdenum boride, or a combination thereof.

6. The method according to claim 1, the second interface layer comprises a thickness of between about 1 nm and about 10 nm.

7. The method according to claim 1, comprising:
the third interface layer includes a tungsten boride, or a molybdenum boride, or a combination thereof; and
the fourth interface layer includes a tungsten boride, or a molybdenum boride, or a combination thereof.

8. The method according to claim 1, forming the interface layers comprises reactively sputtering a tungsten target or a molybdenum target, or a combination thereof, using an unsaturated carbon compound.

9. The method according to claim 1, forming the interface layers comprises non-reactively sputtering a tungsten carbide target, a molybdenum carbide target, a tungsten boride target, or a molybdenum boride target, or a combination thereof.

10. The method according to claim 1, comprising the chalcogenide-based phase-change memory layer including $Ge_2Sb_2Te_5$ or $In_3SbTe_2$.

11. The method according to claim 1, the phase-change memory cell comprises part of a solid-state memory array or a solid-state drive.

* * * * *